United States Patent [19]

Bowman

[11] 4,270,098

[45] May 26, 1981

[54] MEANS FOR LINEARIZING A VOLTAGE VARIABLE CAPACITOR CONTROLLED OSCILLATOR

[75] Inventor: George A. Bowman, Arlington Hts., Ill.

[73] Assignee: Motorola, Inc., Schaumburg, Ill.

[21] Appl. No.: 27,541

[22] Filed: Apr. 5, 1979

Related U.S. Application Data

[63] Continuation of Ser. No. 864,169, Dec. 27, 1977, abandoned.

[51] Int. Cl.$^3$ .............................................. H03B 5/18
[52] U.S. Cl. .................................. 331/96; 331/117 D; 331/177 V
[58] Field of Search ........... 331/36 C, 96, 101, 117 D, 331/177 V; 332/30 V; 334/15

[56] References Cited

U.S. PATENT DOCUMENTS

| | | | |
|---|---|---|---|
| 3,353,117 | 11/1967 | Renkowitz | 331/177 V X |
| 3,579,281 | 5/1971 | Kam et al. | 331/36 C X |
| 3,631,364 | 12/1971 | Schilb et al. | 331/177 V X |
| 3,697,890 | 10/1972 | Healey et al. | 331/177 V X |
| 3,747,032 | 7/1973 | Hall et al. | 333/82 B |

FOREIGN PATENT DOCUMENTS 502474 2/1976 U.S.S.R. .................................. 331/36 C

OTHER PUBLICATIONS

Otala, "Distortion and Its Compensation in a Varactor—Controlled Frequency Modulator", Proc. IEE, vol. 117, No. 2, Feb. 1970, pp. 338-342.

Primary Examiner—Siegfried H. Grimm
Attorney, Agent, or Firm—James A. Scheer; James W. Gillman

[57] ABSTRACT

Frequency modulation of an information signal is provided by applying the signal to series connected voltage variable capacity diodes. The reactance of the diodes is coupled through a transmission line to a cavity oscillator. The varying diode reactance causes a corresponding change in the frequency of modulation of the oscillator.

The improvement comprises a linearization potentiometer which couples to the diodes and provides a means to vary the effective impedance presented to the cavity oscillator such that a linear change in signal voltage applied to the diodes results in a linear change of oscillator frequency.

6 Claims, 5 Drawing Figures

U.S. Patent     May 26, 1981     4,270,098
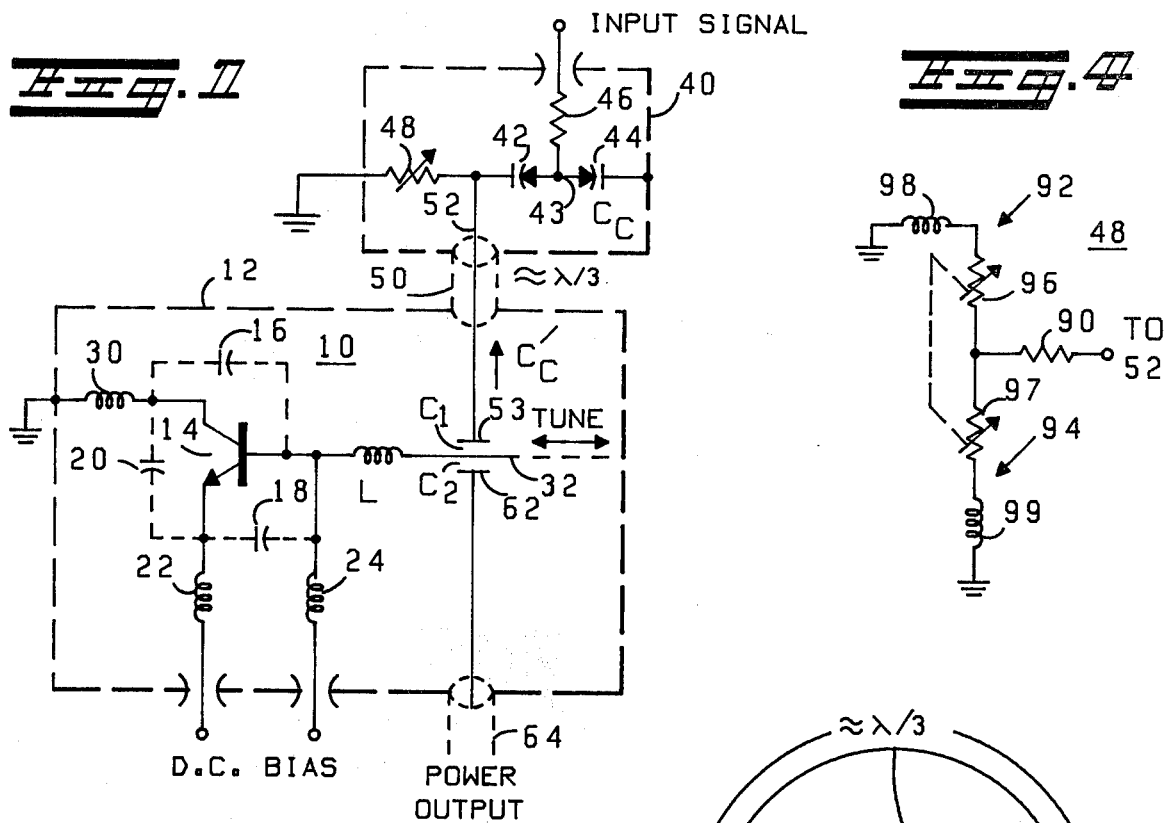
Fig. 1
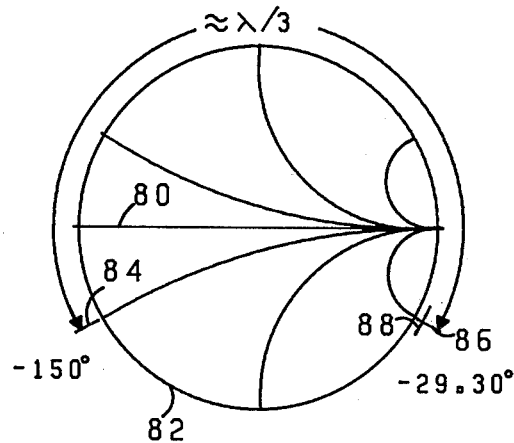
Fig. 4
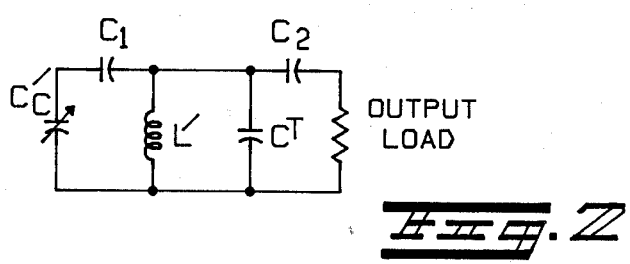
Fig. 2
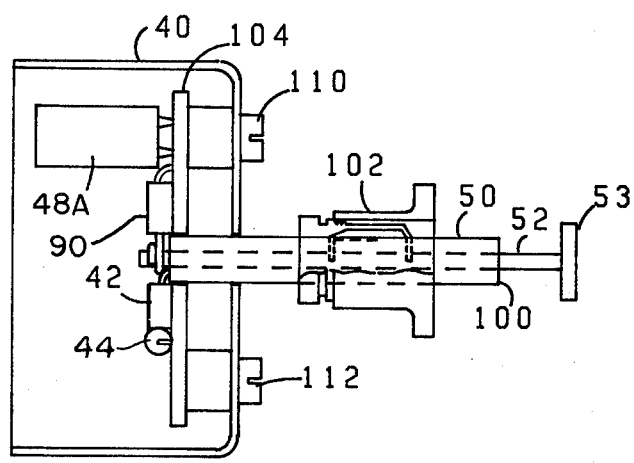
Fig. 3
Fig. 5

MEANS FOR LINEARIZING A VOLTAGE VARIABLE CAPACITOR CONTROLLED OSCILLATOR

This is a continuation of application Ser. No. 864,169, filed Dec. 27, 1977, now abandoned.

BACKGROUND OF THE INVENTION

The present invention pertains to the electrical art and, more particularly, to an improvement in a voltage controlled oscillator.

Voltage variable capacitor controlled oscillators are well-known, particularly in the communication art. There, it has been known to apply a low frequency information signal, such as a signal transduced from speech information, and apply that signal to a voltage variable capacitor which is in tuning configuration in an oscillator. The change in capacitance of the voltage variable capacitor results in a deviation in the tuning of the oscillator stage whereby frequency modulation is effected.

It is generally desirable to be able to change the center freuqency of oscillation of the oscillator without affecting the linearity of the frequency modulation. That is, it is desirable that a linear change in input signal result in a linear deviation in the frequency modulation produced signal. However, whereas in a given frequency this can be assured, once the carrier of the frequency modulated signal is changed, the prior art has known only two ways to readjust the system to achieve the desired linearity. One prior art approach to linearization has been to change the DC voltage applied to the voltage variable capacity diodes. By suitably changing the DC voltage applied to the diodes, the net reactance from the diodes may be located in a range such that the applied information signal produces linear frequency modulation. An alternate prior art approach has been to couple the diodes to the oscillator circuitry through a transmission line. By changing the length of the transmission line, a corresponding change in the effect of the capacitance of the voltage variable capacitors, as seen by the oscillating circuitry, is affected, thereby insuring linear frequency modulation.

These prior art approaches to linearizing the frequency modulation have proved unsatisfactory. For the approach wherein the DC voltage to the voltage variable capacity diodes is varied, special electrical circuitry has to be provided which assures that the DC voltage applied to the voltage variable capacity diodes precisely locates their impedance at the point of linearization. This circuitry has proved difficult to fabricate.

As for the prior art approach of varying the length of a transmission line, this requires a mechanical transmission line structure which may be easily, yet precisely varied. Such a structure is both difficult and expensive to manufacture.

SUMMARY OF THE INVENTION

It is an object of this invention, therefore, to provide an improved means for linearizing a voltage variable capacitor controlled oscillator.

Briefly, according to the invention, the improvement is provided in an oscillator circuit wherein the tuning frequency of the oscillator is a function of a signal voltage applied to a voltage variable capacitor. The improvement comprises a variable impedance which couples to the voltage variable capacitor and provides a means to linearize the oscillator such that a linear change in signal voltage applied to the voltage variable capacitor produces a substantially linear variation in the tuning frequency of the oscillator. Preferably, the variable impedance means is comprised of a potentiometer coupled between the voltage variable capacitor and AC ground potential. By varying the potentiometer, a varying resistive and inductive component is applied, with the reactance of the varactor diodes, to the tuning circuitry of the oscillator, thereby allowing a means to adjust the oscillator for linearized operation.

BRIEF DESCRIPTION OF THE DRAWINGS

FIG. 1 is a schematic diagram illustrating a voltage variable capacity diode tuned cavity oscillator including the inventive linearizaton means;

FIG. 2 is an equivalent schematic diagram of the oscillator shown in FIG. 1;

FIG. 3 is a Smith chart illustrating the impedance variance provided by the instant invention;

FIG. 4 is a schematic diagram of a detailed embodiment of the variable resistance shown in FIG. 1; and FIG. 5 is a cross-sectional view of the preferred mechanical construction of the cavity resonator according to the invention.

DETAILED DESCRIPTION OF THE PREFERRED EMBODIMENT OF THE INVENTION

FIG. 1 is a schematic diagram of the cavity oscillator circuit. Here, an oscillator, indicated generally at 10, is provided within a cavity 12. The oscillator 10 includes an active gain stage comprised of transistor 14. Inherent in transistor 14 is a collector base capacitance 16, an emitter base capacitance 18 and a collector emitter capacitance 20. DC bias to the gain stage 14 is provided through RF chokes 22, 24.

The collector load of stage 14 is comprised of a feedback inductance 30, whose free end is coupled to a ground potential. In the preferred embodiment of the invention, this inductance is comprised of a bar of suitable dimension. The purpose of this bar is to optimize the output power of the oscillator in the frequency band of interest.

A second inductor, L, series couples to the base of transistor 14. Connected with this inductance is a hollowed out tapered tube, 32 which has a screw tuning slug in its free end.

A second enclosure 40 couples through a transmission line 50 whose center connector extends to a disc 53 which capacitively couples to the tube 32. The effective capacitive coupling between disc 53 and tube 32 is indicated at $C_1$. Contained within second enclosure 40 is a pair of voltage variable capacity diodes 42, 44. Diodes 42, 44 are series connected in opposite polarity. The free end of diode 44 connects to the cavity wall, and thus AC ground notential. Applied to the common connection 43 of the diodes 42, 44 is the input information signal, which may be speech or other AC information, as well as a DC bias voltage to bias the diodes in a given range of their capacitance versus voltage characteristic. The effective capacitance of the diodes 42, 44 is indicated as $C_c$. This capacitance is applied to the center conductor 52 of transmission line 50 and is capacitively coupled through capacitor $C_1$ to the tube 32.

In this, the preferred embodiment of the invention, two series connected voltage variable capacity diodes, 42, 44 have been employed to reduce the change in the effective capacity $C_c$ as a function of input signal as well as improving the quality factor. It should be understood, however, that in an alternate construction of the oscillator according to the invention a single voltage variable capacity diode might be used.

Also provided within second enclosure 40 is a potentiometer shown diagrammatically in FIG. 1 by the reference character 48. As is shown, the potentiometer has one free end coupled to the voltage variable capacity diodes 42, 44 at the center conductor 52 of the transmission line 50, with its remaining free end coupled to AC ground potential at the case of the second enclosure 40. As is described more fully hereinbelow, potentiometer 48 provides a means to linearize the frequency modulation.

Finally, referring again to cavity 12, the output from the oscillator stage is provided via a second disc 62 which couples to the center conductor of the output transmission line 64. The output from the oscillator is provided through the capacitive coupling indicated as $C_2$.

FIG. 2 is an equivalent circuit diagram of the oscillator circuit shown in FIG. 1. This is seen to be a basic tank circuit comprised of an inductor $L'$, which is the equivalent of inductor L and inductor 30 of FIG. 1, paralleled by a capacitor $C_T$, which represents the effective total capacitive contribution from the transistors inherent capacitors 16, 18 and 20. Also paralleling inductor $L'$ is a series combination of capacitor $C_1$ and $C'_c$, this capacitance being the effective capacitance $C_c$ of voltage variable capacity diodes 42, 44 as transformed through the approximately one third wavelength transmission line 50. Shown also is the output load which is coupled to the tank circuit via capacitor $C_2$.

As is well known in this art, the tank circuit of FIG. 2 will oscillate at an angular frequency $\omega$ as defined by:

$$\omega = 1/\sqrt{L' \times C'},$$

where $C'$ is the total capacitance comprised of $C_1$, $C_2$, $C_t$ and $C'_c$. Thus, by varying the value of $C'_c$ the frequency of oscillation of the oscillator stage 10 is affected and, in this application, the input signal frequency modulates the carrier signal produced by the oscillator stage 10.

It is desirable, however, that the input signal effect a linear frequency deviation in oscillator 10 as a function of linear change in the input signal. An examination of the capacity versus voltage characteristics of typical voltage variable capacity diodes and the above inverse square law relationship between frequency of oscillation and capacitance indicates that this linear relationship cannot be obtained without further circuit modification.

FIG. 3 is a conventional Smith chart having a horizontal line 80, representative of the resistive DC component of an impedance, contained within a circle 82 corresponding to the reactive component of the impedance. The reactance of the voltage variable capacitors 42, 44 is set, via the applied DC voltage through resistor 46, to be initially at the point 84 which is virtually a pure reactance at $-150°$. Transmission line 50, having an effective length of approximately $\lambda/3$ transforms this impedance of the voltage variable capacity diodes to a point 86 at approximately $-29°$. It has been found that the impedance of the voltage variable capacity diodes related to point 86 produces the effective change of the reactance of these diodes as a function of linear input applied signal causing a corresponding linear frequency modulation of the oscillator signal, thereby producing the desired results.

However, when the carrier frequency of oscillator 10 is varied, as by tuning the slug provided in the tube 32, the desired reactance of the voltage variable capacitors is somewhere other than, but near to point 86. Potentiometer 48 provides a means to return the effective reactance of the varactor diodes to the desired point of maximum linearity. As shown in FIG. 3, the potentiometer 48 provides a means to reset the effective impedance of the capacitors as transformed through the transmission line over a range indicated at 88. Thus, once the carrier frequency of the oscillator 10 is changed, a user need only vary the potentiometer 48 to return the system to its point of optimum frequency modulation linearity. This constitutes a clear advantage over prior art systems which required either a change in the DC voltage applied to voltage variable capacity diodes 42, 44 or a change in the length of transmission line 50 to return to the point of maximum linearity.

FIG. 4 is a circuit schematic of a detailed embodiment of the variable resistance 48 shown in FIG. 1. The circuit as shown diagrammatically is comprised of a series resistor 90, hose free end couples to the center conductor 52 of transmission line 50. The remaining end of resistor 90 connects to shunt branches 92, 94. Each shunt branch 92, 94 is comprised of a series variable resistor 96, 97 and fixed inductor 98, 99, respectively. The inductors 98, 99 are not necessarily formed as discrete elements since they can be inherently part of the potentiometer and the printed circuit board metallization as distributed inductance. The variable resistors 96, 97 are ganged as shown. By varying the potentiometer 48, and thus the ganged variable resistors 96, 97 the effective impedance from potentiometer 48 which appears at the center conductor of transmission line 50 is thus a combination of resistor 90, variable resistors 96, 97 and inductors 98, 99. It is this circuit configuration which allows the tuning of the effective reactance of the voltage variable capacity diodes over the range 88 indicated in FIG. 3. While numerous potentiometers are commercially available which could be practiced in the invention, in the preferred embodiment of the invention a Beckman potentiometer number 72XR1K was used.

FIG. 5 is a cross-sectional diagram illustrating the mechanical construction of the second enclosure 40 and transmission line 50. Shown extending from the center conductor 52 of the transmission line 50 is the disc 53 which, as is shown in FIG. 1, capacitively coupled to the oscillator stage 10. This center conductor 52 is the center conductor of a 0.141 inch semi-rigid coaxial cable. The outer conductor of cable 50 is indicated at 100. A locking collar 102, made of stainless steel, allows lateral movement of the transmission line when not locked. This lateral movement is provided to effect the value of capacity $C_1$, and thereby affect the total quantity of the input signal which is coupled to the oscillator 10 which results in modulation of the oscillator produced carrier signal.

The transmission line 50 is routed within second enclosure 40 having its outer conductor 100 soldered to the ground plane on a circuit board 104 and its center conductor soldered to the free end of the first voltage variable capacity diode 42. This diode, in turn is connected, via metallizations on the printed circuit board 104, to the second voltage variable capacity diode 44.

The linearizing potentiometer 48A is mounted on the printed circuit board 104 and, via fixed resistor 90, is connected to the free end of voltage variable capacity diode 42 and the center conductor 52 of transmission line 50. Stand-offs, 110, 112 support the printed circuit board within the enclosure 40.

In summary, an improved means for linearizing the frequency modulation of an oscillator signal has been shown.

While a preferred embodiment of the invention has been described in detail, it should be apparent that many modifications and variations thereto are possible, all of which fall within the true spirit and scope of the invention.

I claim:

1. In a voltage controlled oscillator wherein an active gain stage is arranged in a circuit configuration to oscillate at a frequency which is a function of a variable reactance coupled to said circuit, the improvement comprising:

voltage variable capacity means comprised of a first and a second voltage variable capacity diode, said diodes having a common connection, arranged to receive a control voltage at the common connection to produce a capacitance related to the level of said control voltage, and with the free end of the first diode being coupled to AC ground;

an impedance transforming means, coupling the free end of the second voltage variable capacity diode to said voltage controlled oscillator for predeterminedly transforming the capacity means such that it is suitable for varying the frequency of oscillation of the oscillator; and variable impedance means, coupled to said impedance transforming means and to the free end of the second voltage variable capacity diode, said variable impedance means being of predetermined value such that the frequency of oscillation of said oscillator is linearly related to the amplitude of the control voltage.

2. The improvement of claim 1 wherein the impedance transforming means is comprised of a transmission line of predetermined electrical length.

3. The improvement of claim 1 wherein said impedance transforming means is comprised of a transmission line having an electrical length of approximately $80\lambda/3$, where $\lambda$ is the approximate wavelength of the oscillation produced by the oscillator.

4. The improvement of claim 3 wherein said transmission line is of fixed length.

5. The improvement of claim 1 wherein said impedance means is comprised of a potentiometer having a variable resistance in circuit configuration with an inductance.

6. The improvement of claim 4 wherein said impedance means is comprised of a potentiometer having a variable resistance in circuit configuration with an inductance.

* * * * *

UNITED STATES PATENT AND TRADEMARK OFFICE
CERTIFICATE OF CORRECTION

PATENT NO. : 4,270,098
DATED : 5/26/81
INVENTOR(S) : George A. Bowman

It is certified that error appears in the above—identified patent and that said Letters Patent is hereby corrected as shown below:

COLUMN 6, line 17 delete "80/3" and insert $--\lambda/3--$

Signed and Sealed this

Twenth-eighth Day of September 1982

[SEAL]

Attest:

GERALD J. MOSSINGHOFF

Attesting Officer     Commissioner of Patents and Trademarks